United States Patent [19]
Runas

[11] Patent Number: 5,500,819
[45] Date of Patent: Mar. 19, 1996

[54] CIRCUITS, SYSTEMS AND METHODS FOR IMPROVING PAGE ACCESSES AND BLOCK TRANSFERS IN A MEMORY SYSTEM

[75] Inventor: Michael E. Runas, McKinney, Tex.

[73] Assignee: Cirrus Logic, Inc., Fremont, Calif.

[21] Appl. No.: 315,934

[22] Filed: Sep. 30, 1994

[51] Int. Cl.$^6$ ................................................ G11C 11/40
[52] U.S. Cl. ............... 365/189.05; 365/205; 365/238.5
[58] Field of Search ........................ 365/205, 189.05, 365/208, 238.5, 189.04, 189.12, 207

[56] References Cited

U.S. PATENT DOCUMENTS

| | | | |
|---|---|---|---|
| 5,088,062 | 2/1992 | Shikata | 365/189.05 |
| 5,278,790 | 1/1994 | Kanabara | 365/189.05 |
| 5,305,284 | 4/1994 | Iwase | 365/189.05 |

Primary Examiner—A. Zarabian

[57] ABSTRACT

A memory 200 is provided which includes an array 201 of volatile memory cells 202. Addressing circuitry 205, 213 is included for providing access to selected ones of the memory cells 202. Master read/write circuitry 208 is included for reading and writing data into the selected memory cells 202. First slave circuitry 210, 211 is provided for storing data for exchange with the master read/write circuitry 208. Second slave circuitry 210/211 is also provided for storing data for exchange with the master read/write circuitry 208. Control circuitry 206, 214, 215 controls the exchanges of data between the master read/write circuitry 208 and the first and second slave circuitry 210, 211.

19 Claims, 1 Drawing Sheet

CIRCUITS, SYSTEMS AND METHODS FOR IMPROVING PAGE ACCESSES AND BLOCK TRANSFERS IN A MEMORY SYSTEM

TECHNICAL FIELD OF THE INVENTION

The present invention relates in general to electronic memories and in particular to circuits, systems and methods for improving page accesses and block transfers in a memory system.

BACKGROUND OF THE INVENTION

Page mode (burst mode) accessing is often used to access one or more entire words from a given row of a dynamic random access memory (DRAM) array during a single address cycle. During a DRAM page mode access (either a read or a write), a row address is presented to the device address port and latched in with a row address strobe (RAS) to select a given row in the array. A column address strobe is next presented to the address port and latched in with a column address strobe (CAS) to select a first column thereby allowing access to a first cell (bit) along the selected row. Column decode circuitry (static or dynamic) then increments from the received column address to generate a sequence of column addresses to adjacent columns, thereby allowing access to a sequence or "page" of cells (bits) from the selected row.

The page (burst) length of currently available DRAMs operating the page (burst) mode is partly limited by the available column address space. In other words, the number of bits which can be accessed as a single page is dependent on the number of memory cells attached to given word line. Once the available memory cells have been exhausted, a complete new address cycle must be initiated, including precharging, the presentation and latching-in of a row address and the presentation and latching-in of a new initial column address. With each new address cycle an access time penalty is paid.

Thus, the need has arisen for circuits, systems and methods for improving the speed and efficiency of page mode (burst mode) accesses to a DRAM device. Further, as discussed further below, such circuits, systems and methods should be applicable to the improvement of the speed and efficiency of bit block transfers. Bit block transfer (BitBLT) is an important performance enhancement technique used in digital data processing applications, and in particular in "windowing" applications. In general, in a bit block transfer ("block move"), an entire block of data (also known as bitmaps) is transferred from a first (source) block of storage locations in display memory to a second (destination) block of storage locations in display memory. In graphics systems BitBLTs can improve operational speed since the data transfers typically remain local in the graphics controller thereby reducing the tasks required to be performed by the CPU. Similarly, entire blocks of data may be copied from a set of source locations in memory to a set of destination locations in memory by a block copy.

There are a number of known techniques for implementing bit block transfers (copies). For example, a block of source locations in memory may be identified by the addresses corresponding to a pair of "corners" of the block (or two pairs of corners if the block is a rectangle); the address of one "corner" defining a starting row and a starting column address, and the address of a second corner defining an ending row and an ending column address. Once the starting and ending addresses for the block are specified, the remaining source addresses can be derived therefrom using counters and associated circuitry. The destination block can similarly be identified. It should be noted that there are other known techniques of identifying a block of storage locations, such as defining a single starting address ("corner") and the size ("dimensions") of the block being moved or copied. To implement the actual transfer, the BitBLT circuitry and software sequence through the source addresses and each word in the identified source block is moved (or copied) from its source address and sent to a corresponding destination address. In essence, typical bit block transfer techniques read data from the source block of memory locations a word or byte at a time and then write that data into the destination block of memory a word or byte at a time. It should also be noted that some BitBLT implementations can perform more sophisticated operations which cross "byte" boundaries in a word.

In windowing display systems, bit block transfers are often used when blocks ("windows") of information are transferred from one position on the display screen to another position on the display screen, such as when a data window is dragged across the screen by a mouse, or a "window" on a screen is "processed" for some specific application. In this case, the bit block transfer circuitry and software move the corresponding pixel data in the frame buffer (display memory) from the address space corresponding to the original position on the display screen to the address space corresponding to the new position on the display screen. The bit block transfer allows pre-existing pixel data to be used to generate data on the display screen thereby eliminating the need for the system CPU to regenerate the same pixel data to define the same image on the screen. Similarly, bit block transfers can be used when blocks of information are being copied on the display screen. In this case, the corresponding pixel data is replicated by the bit block transfer circuitry and software and written into one or more additional address spaces of the frame buffer corresponding to the new areas of the display screen to which the original displayed data is being copied.

In the speed of presently available bit block transferring systems is limited by the fact that such systems move or copy data from one address space to another address space in memory on a byte or word basis. Thus, the need has arisen for improved circuits, systems and methods for implementing bit block transfers. In particular, such methods, systems and circuits should be applicable to the movement and/or copying of pixel data within the frame buffer of a display system.

SUMMARY OF THE INVENTION

In general, the principles of the present invention provide for the construction of a memory which includes an array of volatile memory cells, address decode circuitry for selecting rows and/or columns of cells in the memory array, and master sense amplifier circuitry for reading and writing data into those selected cells. At least two sets of latching circuitry are provided coupled to the master sense amplifiers for temporarily storing data being exchanged with the master sense amplifiers during read and write operations to the array of memory cells. In particular, the latching circuits can be used alternately to pipeline data to and from the master sense amplifiers during read and write operations to ensure continuous data flow. Further, one or more of the latching circuits can be used during a block move/copy operation to temporarily store the data being moved/copied while the memory array is being reconfigured from a state allowing a read of source information to a state of allowing the data to be read to a destination location.

According to one embodiment of the present invention, a memory is provided including an array of volatile memory cells addressing circuitry for providing access to selected ones of the memory cells and master read/write circuitry for reading an writing data into the selected memory cells. First and second slave circuitry is provided for storing data for exchange with the master read/write circuitry. Control circuitry is provided which controls exchanges of data between the master read/write circuitry and the first and second slave circuitry.

According to a second embodiment of the present invention, a memory system is provided which includes an array of memory cells arranged in rows and columns, each of the rows associated with a conductive wordline in each of the columns associated with a conductive bitline. A row decoder is coupled to each of the wordlines while a bank of master sense amplifiers is coupled to the bitlines. A plurality of banks of slave sense amplifiers are coupled to the master sense amplifiers with a column decoder coupled to each of the plurality of slave sense amplifiers. Control circuitry is coupled to the row decoder, the bank of master sense amplifiers and the bank of slave sense amplifiers.

According to a further embodiment of the present invention, a memory is provided which includes an array of dynamic random access memory cells arranged in rows and columns, each row including a conductive wordline and each column including a conductive bitline. Row decoder circuitry is coupled to the wordlines for selecting a given row in response to a row address. Sense amplifier circuitry is coupled to the bitlines for reading/writing data to selected ones of the cells along a selected row. Column decoder circuitry is provided coupled to a databus. First latching circuitry is coupled to the sense amplifier circuitry by a first local bus and to the column decoder by a second local bus and latches data being exchanged between the sense amplifier circuitry and the column decoder. A second latching circuitry is coupled to the sense amplifier circuitry by the first local bus into the column decoder by the second local bus and latches data being exchanged between the sense amplifier circuitry and the column decoder. Control circuitry controls the first and second latching circuitry, the control circuitry alternately latching data being exchanged between the sense amplifier circuitry and the column decoder in the first latching circuitry and the second latching circuitry.

The principles of the present invention are also embodied in methods for reading and writing data into a memory device. In a first method according to the principles of the present invention, a method is provided for reading data from a memory including an array of memory cells arranged in rows and columns, with each row associated with a conductive wordline and each column associated with a conductive bitline. A first row to be read is selected by activating the associated wordline. The bitlines are then sensed with a bank of master sense amplifiers to read the data stored in the cells of the first row. The data read from the cells of the first row are latched in a first set of slave sense amplifiers. A second row to be read is selected by activating the associated wordline. The bitlines are then sensed with the master sense amplifier to read data stored in the cells of the second row. The data read from the cells of the second row are then latched in a second set of slave sense amplifiers.

According to the principles of the present invention, a method is provided for writing data to a memory including an array of memory cells arranged in rows and columns each row associated with a conductive wordline and each column associated with a conductive bitline. First data is latched in a first bank of slave sense amplifiers. This first data is then written into first selected cells in the array. Substantially concurrently with the step of writing the first data into the array, second data is latched in a second bank of slave sense amplifiers. The second data is then written into second selected cells in the array upon completion of the step of writing the first data into the array.

A method is also provided for performing a block transfer within a memory including an array of memory cells arranged in rows and columns, each row associated with a conductive wordline and each column associated with a conductive bitline. A row is selected in the array. The bitlines of the array are sensed to read data stored in the cells of the selected row with a bank of master sense amplifiers. The data read from the selected cells of the array are latched in a bank of slave sense amplifiers. The data is then written through the master sense amplifier to other cells in the array.

Circuits, systems and methods embodying the principles of the present invention provide, among other things, for improved page accesses and block transfers in a memory system. In particular, embodiments of the present invention allow for entire rows of data to be continuously read and/or written to corresponding rows in the memory array. This allows for improvement in both page length and access time during page mode accesses. Further, embodiments of the present invention provide for faster and more efficient bit block transfers. Specifically, the embodiments of the present invention, among other things, can transfer entire rows of data within memory in contrast the byte-by-byte transfers of the prior art. Such capabilities are particularly applicable to the construction and operation of frame buffer memories used in video/graphics data processing systems.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
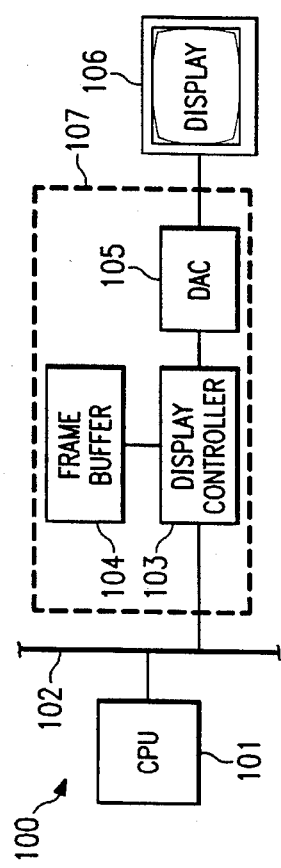
FIG. 1 is a functional block diagram of a video/graphics processing system.
Figure 2:
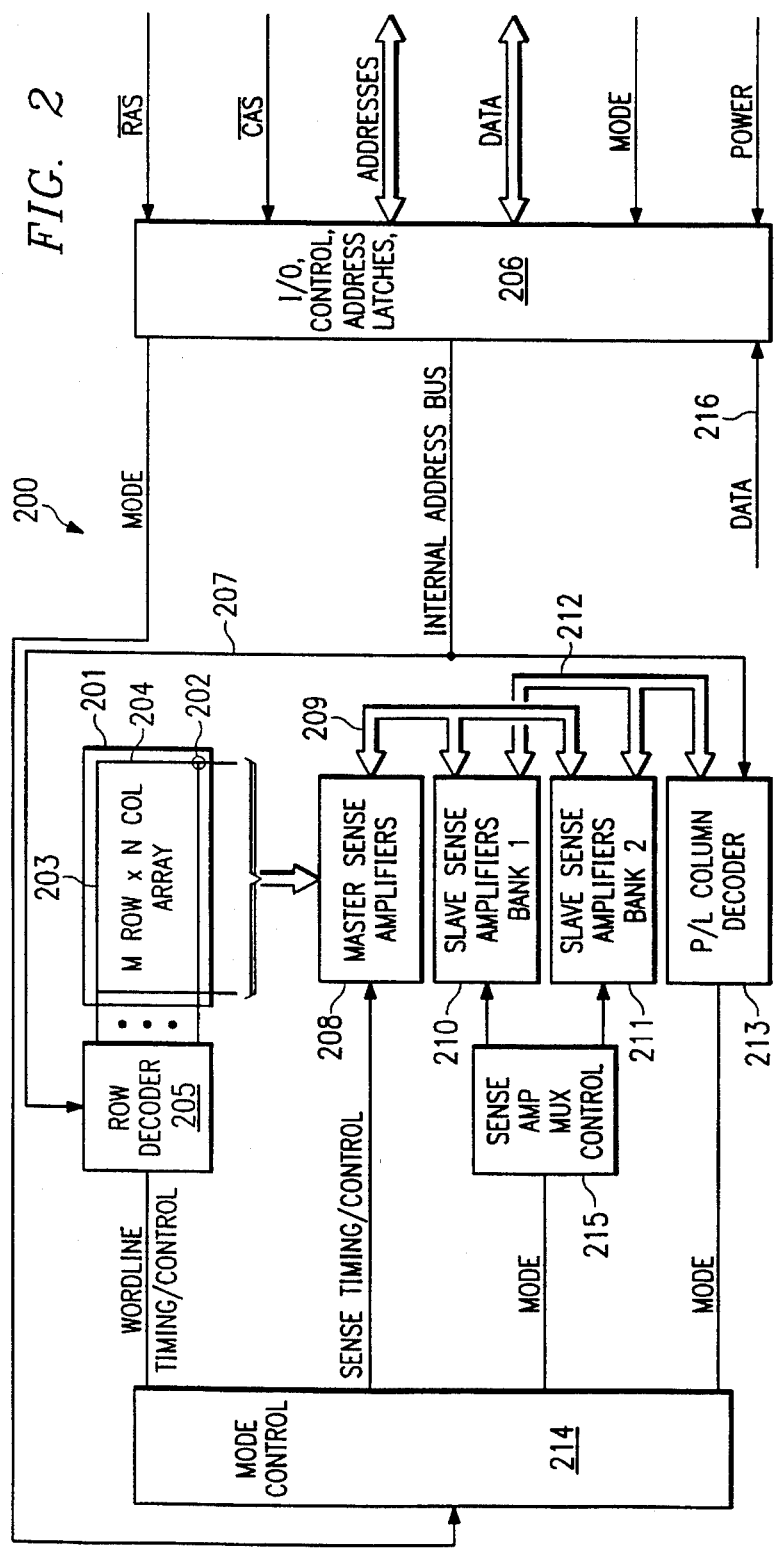
FIG. 2 is a functional block diagram of a memory system embodying the principles of the present invention, the memory system of FIG. 2 suitable in one application to the implementation of the frame buffer of FIG. 1.

The principles of the present invention and their advantages are best understood by referring to the illustrated embodiment depicted in FIGS. 1–2 of the drawings, in which like numbers designate like parts. It should be recognized that, while the principles of the present invention will be illustrated within the context of a graphics/video processing system, block transfer circuits, systems and methods according to these principles may be employed in any one of a number of processing applications.

FIG. 1 is a high level functional block diagram of the portion of a processing system 100 controlling the display of graphics and/or video data. System 100 includes a central processing unit 101, a system bus 102, a display controller 103, a frame buffer 104, a digital-to-analog converter (DAC) 105 and a display device 106.

CPU 101 controls the overall operation of system 100, determines the content of any graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format various circuitry, and/or x- and y-zooming circuitry, to name a few options. In the illustrated embodiment, display controller 103, frame buffer 104 and DAC 105 are fabricated together as a single integrated circuit (chip) 107.

Display 106 may be for example a CRT unit, liquid crystal display, electroluminescent display (ELD), plasma display (PLD), or other type of display device which displays images on a display screen as a plurality of pixels.

In the illustrated embodiment, system 100 is a VGA system driving a display screen on display 106 of 640 columns by 480 rows of pixels. Also for purposes of illustration, each pixel will be assumed to be defined by 24-bits of RGB data (i.e., 8-bits each for red, green, and blue). Thus, the absolute maximum size of the physical memory of frame buffer 104 will be 640 columns by 480 rows by 24-bits per pixel or approximately one megabyte. It should be noted that the "visual pixels" on the display screen may or may not exactly map to the storage locations in the physical memory of frame buffer 104, depending on the memory formatting selected. Further, all 24-bits of color data defining each pixel may be physically stored in sequential storage locations in physical memory (in which case, all 24-bits could be stored in a given page) or may be stored in three different banks or rows of the physical memory of the frame buffer 104.

FIG. 2 is a functional block diagram of a memory system 200 embodying the principles of the present invention. Memory system 200 includes an array 201 of memory cells 202 arranged in M number of rows and N number of columns. Each row is associated with a conductive row line (wordline) 203 and each column is associated with a conductive column line (bitline) 204. A selected representative memory cell 202 is depicted in FIG. 2 at the intersection of a corresponding row line 203 and bit line 204 for reference, although the actual number of cells 202, bitlines 204 and wordlines 203 in a typical implementation is substantially larger. In the preferred embodiment, each memory cell 202 is a dynamic random access memory cell (DRAM) cell. The row lines 203 of memory array 201 are coupled to a row decoder 205. Row decoder 205 is operable to select (charge) a row line 203 in response to a row address received from input/control circuitry 206 via internal address bus 207. Row addresses may be received from external circuitry and latched into input/output-control circuitry 206 in response to a corresponding row address strobe (RAS). As discussed further below, row addresses may also be generated internally (within either control circuitry 206 or within row decoder 205 itself) to perform page and block accesses.

The bit lines 204 of memory array 201 are coupled to a bank 208 of master sense amplifiers. Master sense amplifiers 208 are also coupled via a local sense amplifier bus 209 to a first bank 210 (bank 1) of slave sense amplifiers and a second bank 211 (bank 2) of slave sense amplifiers. Slave sense amplifier banks 210 and 211 are further coupled by a local data I/O bus 212 to column decoder circuitry 213.

Mode control circuitry 214 receives mode control signals from input circuitry 206 and provides in response wordline timing and control signals to row decoder 205 and sense timing and control signals to master sense amplifiers 208. Mode control circuitry 214 further provides mode control signals to column decoder circuitry 213 and sense amplifier multiplexer control circuitry 215. Sense amplifier multiplexer control circuitry 215 controls the enablement of slave sense amps banks 210 and 211, as described further below.

In a random access (read or write) to the cells 202 of array 201, a row address is presented to row decoder 205 to select a row and a column address is presented to column decoder 213 to select one or more columns and hence one or more cells 202 along the selected row. The row and column addresses may for example be received from an external source, such display controller 103 in system 100, along with RAS and CAS. (In this case, slave sense amplifier banks 210 and 211 are transparent and master sense amplifier bank 208 sets the selected bitlines 204 to the proper voltages.)

According to the principles of present invention, memory system 200 is operable to "hide" random accesses to array 201 wherein entire blocks (pages) of data may be accessed at one time.

During a page (burst) read, an initial row address is presented to input circuitry 206 and latched-in with RAS. Row decoder 205 in response charges the corresponding wordline 203 and master sense amps 209 sense bitlines 204 to read the data in the cells 202 along the selected row. Once the sense operation is concluded, the data read out of the selected cells is transferred from master sense amplifier bank 208 bank to first slave sense amplifier bank 210 via local sense amp bus 209. Slave sense amplifier 210 latches the data. Additionally, sense amplifier MUX control circuitry 215 presents the data latched in the first slave sense amps bank 210 to column decoder circuitry 213 via local I/O bus 212. At the same time, the currently selected row is deselected (i.e., the corresponding word line 203 is brought to ground) and array 201 is put into precharge.

Following the precharge operation, a new row address is presented to row decoder 205. This new address is preferably internally generated by circuitry with input/output—control circuitry 206 (or alternatively by circuitry within row decoder 205). For example, the new address may be generated using a look-ahead register or with an internal row address counter using the initial address received from an external source. Once the new address has been presented to row decoder 205, a new word line 203 is selected and a sense operation is performed by master sense amplifiers 208 to read the data from the cells 202 of the new selected row. Once this new sensing operation is complete, the data stored (latched) by master sense amps 208 are transferred to the second slave sense amplifier bank 211 via bus 209 and latched. A new precharge operation is initiated to precharge array 201. The read process can then be repeated, preferably using internally generated addresses, alternating the data latching between slave sense amplifier banks 210 and 211.

According to the principles of the present invention, when memory system 200 is operating in a burst read mode, as soon as some of the data in first slave sense amplifier bank 210 has been read onto data bus 216 (as selected by column decoder 213), sense amplifier MUX control circuitry 215 enables second slave sense amp bank 211 to present its data stored to column decoder 213. Not only does this technique allow for a page mode read of a much larger number of bits than can be provided by a single row address, but also allows data to be "continuously" presented to data bus 216, especially when long burst or pages of data are being read. In other words, as data is being sent to bus 216 from one of the slave sense amp banks 210 or 211, a precharge and/or read of a new row from the memory array 201 simultaneously be taking place.

It should be noted that a similar operation may be performed to write entire rows (or portions of rows) of data to memory cell array 201. In this case, following precharge, a row of data is latched into a first one of the slave sense amplifier banks 210 or 211, and while that first row of data is being written into array 201 through master sense amplifiers 208, a second row of data is transferred from data bus 216 to the other bank 210 or 211. The array 201 is again precharged and the second row of data written into a second addressed row of cells. During this cycle, a third row of data is latched into the first bank of slave sense amplifiers 210 or 211. The process is repeated, alternating data inputs and writes to the array in this fashion until a desired block of data has been written. Preferably, each slave sense amplifier bank 210 and 211 includes write driver (buffer) circuitry which provides sufficient write voltage drive to cause master sense amplifiers 208 to latch the proper write voltages and transfer these voltages to the bitlines 204.

Memory architectures according to the principles of the present invention, such as the architecture of the illustrated memory system 200, also advantageously provide for efficient block moves/copies of data within memory. For example, the contents of one row in array 201 may be moved/copied to another row in array 201 using slave sense amp banks 210 and 211 (i.e., a row move). Alternatively, bits of data may be moved from one or more cells 202 along a given row to another cell or cells along the same row (i.e., column move). By repeated moving/copying of data from one row to another an entire block of data within memory array row 201 may be moved.

In the case of a row move, the first (source) row is selected by providing an address (as generated either internally or externally) to row decoder 205 following precharge of the array. The data from the source row is then sensed and latched by master sense amp bank 208. Next, the data from the source row is moved into a selected one of the slave sense amp banks 210 or 211. Array 201 is precharged and a new row address (generated either internally or externally) is presented to row decoder 205 to select a destination row. Once the destination row is selected and sensed by master sense amp bank 208, the data stored in the selected slave sense amp 210 or 211 is driven onto local sense amplifier bus 209, through master sense amplifiers 208 and into the memory cells 202 along the destination row. It should be recognized that this operation could be done for all or a portion of the cells along the source/destination rows (i.e., for all or a portion of the column address space).

Similarly, a block of cells may be moved along the same row. It should be noted that this operation only takes a single "cycle" in comparison to the row move discussed above. The array 201 is precharged, a row selected by an appropriate row address (generated either externally or internally), and the bitlines 204 sensed by master sense amplifiers 208. The resulting row of data is then transferred to a selected one of the slave sense amplifier banks 210 or 211. Selected bits of data can then be shifted between the latches of the selected slave sense amplifier bank 210 or 211 to implement the move/copy. The modified row of data is then written back to the selected row through master sense amplifiers 208.

Although the present invention and its advantages have been described in detail, it should be understood that various changes, substitutions and alterations can be made herein without departing from the spirit and scope of the invention as defined by the appended claims.

What is claimed is:

1. A memory comprising:

an array of rows and columns of volatile memory cells;

addressing circuitry for providing access to selected ones of said memory cells;

master read/write circuitry for reading and writing data into said selected ones of said cells;

first slave circuitry for storing data for exchange with said master read/write circuitry;

second slave circuitry for storing data for exchange with said master read/write circuitry; and control circuitry for controlling exchange of data between said master read/write circuitry and said first and second slave circuitry, said control circuitry operable during a move operation to:

control sensing by said master read/write circuitry of data from a said row in said array selected by said addressing circuitry;

control transfer of said data from said master read/write circuitry to a selected one of said first and second slave circuitry; and control writing of said data through said master read/write circuitry to a second said row in said array selected by said addressing circuitry.

2. The memory of claim 1, wherein said control circuitry is further operable to control the exchange of data between said master read/write circuitry and said first slave circuitry during a first access cycle and between said master read/write circuitry and said second slave circuitry during a second subsequent access cycle.

3. The memory of claim 1 wherein said array comprises an array of dynamic random access memory cells.

4. The memory of claim 1 wherein said addressing circuitry comprises a row decoder for selecting a row of cells in said array.

5. The memory of claim 1 wherein said master read/write circuitry comprises a plurality of sense amplifiers.

6. The memory of claim 1 wherein each of said first and second slave read/write circuitry comprises a plurality of sense amplifiers.

7. A memory system comprising:

an array of memory cells arranged in rows and columns, each said row associated with a conductive wordline and each said column associated with a conductive bitline;

a row decoder coupled to said wordlines;

a bank of master sense amplifiers coupled to said bitlines;

a plurality of banks of slave sense amplifiers coupled to said master sense amplifiers;

a column decoder coupled to each of the plurality of banks of slave sense amplifiers; and control circuitry coupled to said row decoder, said bank of master sense amplifiers and said banks of slave sense amplifiers, said control circuitry including mode control circuitry coupled to said row decoder and said master sense amplifiers and multiplexer control circuitry coupled to said mode control circuitry and said plurality of banks of slave sense amplifiers, said control circuitry operable during a move operation to:

control sensing by said master sense amplifiers of data from a said row in said array selected by said row decoder;

control transfer of said data from said master sense amplifiers to a selected one of said banks of slave sense amplifiers;

control writing of said data through said master sense amplifiers to a second said row in said array selected said row decoder.

8. The memory system of claim 7 wherein said control circuitry is operable during a read operation to:

control sensing by said master sense amplifiers of first data from first said row in said array selected by said row decoder;

control transfer of said first data from said master sense amplifiers to a first one of said banks of slave sense amplifiers;

control sensing by said master sense amplifiers of second data from a second said row in said array selected by said row decoder; and control transfer of said second data from said master sense amplifiers to a second one of said banks of slave sense amplifiers.

9. The memory system of claim 8 wherein said column decoder is operable during a read operation in response to at least one column address to:

output selected ones of said first data presented by said first one of said banks of slave amplifiers; and following the output of said first data, output selected ones of said second data presented by said second one of said banks of slave amplifiers.

10. The memory system of claim 7 wherein said control circuitry is operable during a write operation to:

control transfer of first data from said column decoder to a first one of said banks of slave sense amplifiers;

control writing of said first data into first selected ones of said cells in said array through said master sense amplifiers;

control transfer of second data from said column decoder to a second one of said banks of slave sense amplifiers; and control writing of said second data into second selected ones of said cells in said array through said master sense amplifiers.

11. The memory system of claim 10 wherein said control circuitry is operable during said write operation to transfer said second data from said column decoder to said second one of said banks of slave sense amplifiers concurrently with the writing of said first data into said array.

12. A memory system comprising:

an array of memory cells arranged in rows and columns, each said row associated with a conductive wordline and each said column associated with a conductive bitline;

a row decoder coupled to said wordlines;

a bank of master sense amplifiers coupled to said bitlines;

a plurality of banks of slave sense amplifiers coupled to said master sense amplifiers;

a column decoder coupled to each of the plurality of banks of slave sense amplifiers; and said control circuitry including mode control circuitry coupled to said row decoder and said master sense amplifiers and multiplexer control circuitry coupled to said mode control circuitry and said first and second banks of slave sense amplifiers, said control circuitry operable during a block move operation to:

control sensing by said master sense amplifiers of data from a said row in said array selected by said row decoder;

control transfer of said data from said master sense amplifiers to a selected one of said banks of slave sense amplifiers;

control shifting of said data from a first set of slave sense amplifiers to a second set of slave sense amplifiers within said selected bank of slave amplifiers; and control writing of said data through said master sense amplifiers to ones of said cells along said selected said row associated with said bitlines coupled to said second set of slave sense amplifiers.

13. A memory comprising:

an array of dynamic random access memory cells arranged in rows and columns, each said row including a conductive wordline and each said column including a conductive bitline;

row decoder circuitry coupled to said wordlines for selecting a said row in response to a row address;

master sense amplifier circuitry coupled to said bitlines for reading and writing data to ones of said cells along a selected said row;

column decoder circuitry coupled to a data bus;

first latching circuitry coupled to said sense amplifier circuitry by a first local bus and to said column decoder by a second local bus for latching data being exchanged between said sense amplifier circuitry and said column decoder;

second latching circuitry coupled to said sense amplifier circuitry by said first local bus and to said column decoder by said second local bus for latching data being exchanged between said sense amplifier circuitry and said column decoder; and control circuitry for:

causing said master sense amplifier circuitry to sense data from a said row selected by said row decoder;

transferring said data from said master sense amplifier circuitry to said first slave sense amplifier circuitry;

writing said data from said first slave sense amplifiers to said second row selected by said row decoder;

causing said master sense amplifier circuitry to sense data from a third said row selected by said row decoder;

transferring said data from said master sense amplifier circuitry to said second slave sense amplifier circuitry; and writing said data from said second slave sense amplifiers to a fourth said row selected by said row decoder.

14. The memory of claim 13 wherein said first and second latching circuitry comprise sense amplifier circuitry.

15. The memory of claim 13 and further comprising input/output control circuitry coupled to said row decoder and said column decoder by an address bus, said input/output control circuitry operable to present row and column addresses received from an external source on said address bus for selecting ones of said rows and columns.

16. The memory of claim 15 wherein said input/output control circuitry is further operable to internally generate row addresses for presentation on said address bus.

17. A method of performing a block transfer within a memory including an array of memory cells arranged in rows and columns, each said row associated with a conductive wordline and each said column associated with a conductive bitline, comprising the steps of:

selecting a row in the array;

sensing the bitlines of the array to read data stored in the cells of the selected row with a bank of master sense amplifiers;

latching the data read from the cells of the selected row in a bank of slave sense amplifiers;

writing the data stored in the slave sense amplifiers through the master sense amplifiers to different cells in the array.

18. The method of claim 17 wherein said step of writing comprises the substeps of:

shifting the data within the slave sense amplifiers from a first selected set of said slave amplifiers to a second selected set of said slave amplifiers; and writing the data from the second set of slave amplifiers to the different cells in the selected row in the array.

19. The method of claim 17 wherein said step of writing comprises the step of writing data from the slave sense amplifiers to cells of a different row in the array.

* * * * *

US005500819C1

(12) EX PARTE REEXAMINATION CERTIFICATE (9553rd)
United States Patent
Runas

(10) Number: US 5,500,819 C1
(45) Certificate Issued: Mar. 12, 2013

(54) CIRCUITS, SYSTEMS AND METHODS FOR IMPROVING PAGE ACCESS AND BLOCK TRANSFERS IN A MEMORY SYSTEM

(75) Inventor: Michael E. Runas, McKinney, TX (US)

(73) Assignee: Intellectual Ventures II LLC, Wilmington, DE (US)

Reexamination Request:
No. 90/012,569, Sep. 14, 2012

Reexamination Certificate for:
Patent No.: 5,500,819
Issued: Mar. 19, 1996
Appl. No.: 08/315,934
Filed: Sep. 30, 1994

(51) Int. Cl.
*G11C 7/10* (2006.01)
(52) U.S. Cl. .................. 365/189.05; 365/205; 365/238.5
(58) Field of Classification Search .................. None
See application file for complete search history.

(56) References Cited

To view the complete listing of prior art documents cited during the proceeding for Reexamination Control Number 90/012,569, please refer to the USPTO's public Patent Application Information Retrieval (PAIR) system under the Display References tab.

*Primary Examiner* — Woo H Choi

(57) ABSTRACT

A memory 200 is provided which includes an array 201 of volatile memory cells 202. Addressing circuitry 205, 213 is included for providing access to selected ones of the memory cells 202. Master read/write circuitry 208 is included for reading and writing data into the selected memory cells 202. First slave circuitry 210, 211 is provided for storing data for exchange with the master read/write circuitry 208. Second slave circuitry 210/211 is also provided for storing data for exchange with the master read/write circuitry 208. Control circuitry 206, 214, 215 controls the exchanges of data between the master read/write circuitry 208 and the first and second slave circuitry 210, 211.

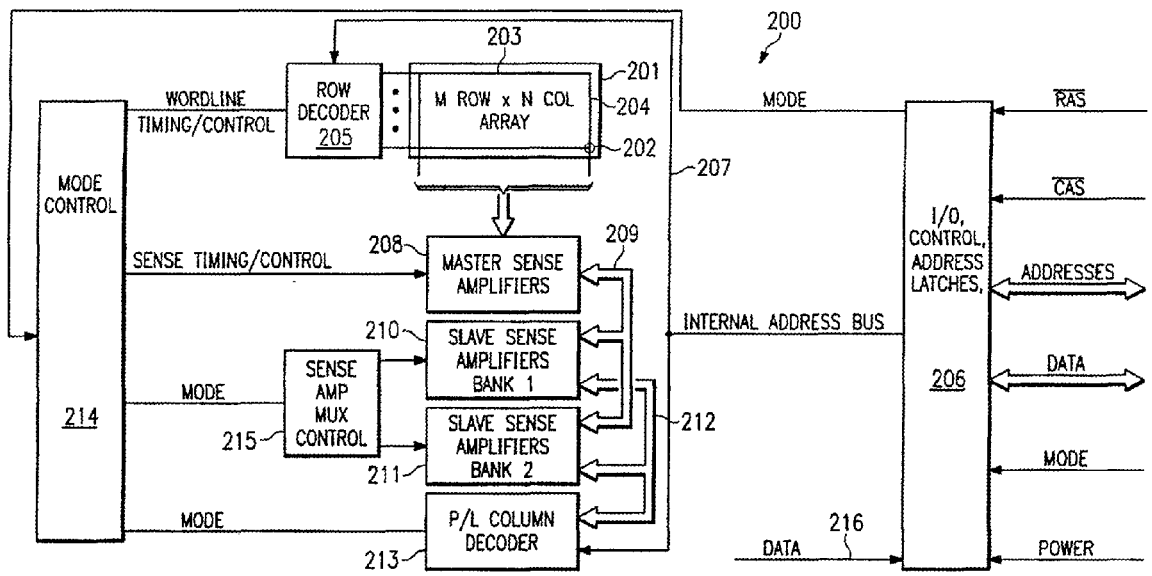

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 17 and 19 is confirmed.

Claims 1-16 and 18 were not reexamined.

* * * * *